United States Patent
Chandrashekara et al.

(10) Patent No.: US 12,327,598 B2
(45) Date of Patent: Jun. 10, 2025

(54) ULTRA-LOW POWER, HIGH SPEED POLY FUSE EPROM

(71) Applicant: TEXAS INSTRUMENTS INCORPORATED, Dallas, TX (US)

(72) Inventors: Likhita Chandrashekara, Bangalore (IN); Yash Didhe, Dombivli (IN); Rajat Chauhan, Bangalore (IN); Devraj Rajagopal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 18/114,449

(22) Filed: Feb. 27, 2023

(65) Prior Publication Data

US 2024/0071539 A1    Feb. 29, 2024

Related U.S. Application Data

(60) Provisional application No. 63/400,501, filed on Aug. 24, 2022.

(51) Int. Cl.
| | | |
|---|---|---|
| G11C 17/18 | (2006.01) | |
| G11C 17/16 | (2006.01) | |
| H01L 23/525 | (2006.01) | |
| H10B 20/25 | (2023.01) | |

(52) U.S. Cl.
CPC .............. *G11C 17/18* (2013.01); *G11C 17/16* (2013.01); *H01L 23/5256* (2013.01); *H10B 20/25* (2023.02)

(58) Field of Classification Search
CPC ........... G11C 17/18; G11C 17/16; G11C 7/06; H01L 23/5256; H10B 20/25
See application file for complete search history.

(56) References Cited

U.S. PATENT DOCUMENTS

| | | |
|---|---|---|
| 7,339,848 B1 | 3/2008 | Stansell et al. |
| 8,441,266 B1 | 5/2013 | Xiao et al. |
| 2009/0002119 A1 | 1/2009 | Nirschl |
| 2009/0219746 A1 | 9/2009 | Bosmuller et al. |
| 2013/0170276 A1* | 7/2013 | Daigle .................. G11C 17/18 365/96 |

* cited by examiner

*Primary Examiner* — Sultana Begum
(74) *Attorney, Agent, or Firm* — Andrew R. Ralston; Frank D. Cimino (57) ABSTRACT

One example includes an integrated circuit with a sense amplifier that includes a first inverter having a first positive power terminal, a first input and a first output; and a second inverter having a second positive power terminal, a second input connected to the first output and a second output connected to the first input. The integrated circuit also includes a reference resistor connected between a positive voltage rail and the second positive power terminal. A fuse is connected between the positive voltage rail and the first positive power terminal.

18 Claims, 7 Drawing Sheets

FIG. 7

ULTRA-LOW POWER, HIGH SPEED POLY FUSE EPROM

CROSS REFERENCE TO RELATED APPLICATIONS

This application claims the benefit of U.S. provisional application Ser. No. 63/400,501 filed Aug. 24, 2022 which is incorporated herein by reference in its entirety.

FIELD

This disclosure relates to the field of semiconductor devices, and more particularly, but not exclusively, to memory cells.

BACKGROUND

Electrically-programmable memory cells enjoy uses in many contexts, including trimming various analog circuits to account for manufacturing variation. Such cells consume valuable space on an IC die, and may contribute to reliability issues.

SUMMARY

One example includes an integrated circuit with a sense amplifier that includes a first inverter having a first positive power terminal, a first input and a first output; and a second inverter having a second positive power terminal, a second input connected to the first output and a second output connected to the first input. The integrated circuit also includes a reference resistor connected between a positive voltage rail and the second positive power terminal. A fuse is connected between the positive voltage rail and the first positive power terminal.

Another example provides a method of forming an integrated circuit. First and second inverters are formed that extend into a semiconductor substrate. A fuse and a resistor are formed over the semiconductor substrate. The fuse is connected between an upper power rail and a positive power terminal of the first inverter. The resistor is connected between the upper power rail and a positive power terminal of the second inverter. An output of the first inverter is connected to an input of the second inverter, and an output of the second inverter is connected to an input of the first inverter.

Yet another example provides an integrated circuit. The integrated circuit includes a first NMOS transistor and a first PMOS transistor formed over a semiconductor substrate and connected to form a first inverter having a first output node and a first input node. The integrated circuit also includes a second NMOS transistor and a second PMOS transistor formed over the semiconductor substrate and connected to form a second inverter having a second output node and a second input node. The first output node is connected to the second input node, and the second output node is connected to the first input node. A reference resistor is connected between a positive voltage rail and a source of the first PMOS transistor, and a fuse is connected between the positive voltage rail and a source of the second PMOS transistor.

DETAILED DESCRIPTION

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

This application discloses various methods and devices that may be beneficially applied to integrated circuits (ICs), such as those including electrically programmable fuse memory cells, e.g. by reducing static current and providing a short read time. While such embodiments may be expected to provide improvements such as reducing overall IC power requirements, no particular result is a requirement of the described invention(s) unless explicitly recited in a particular claim.

Figure 1:
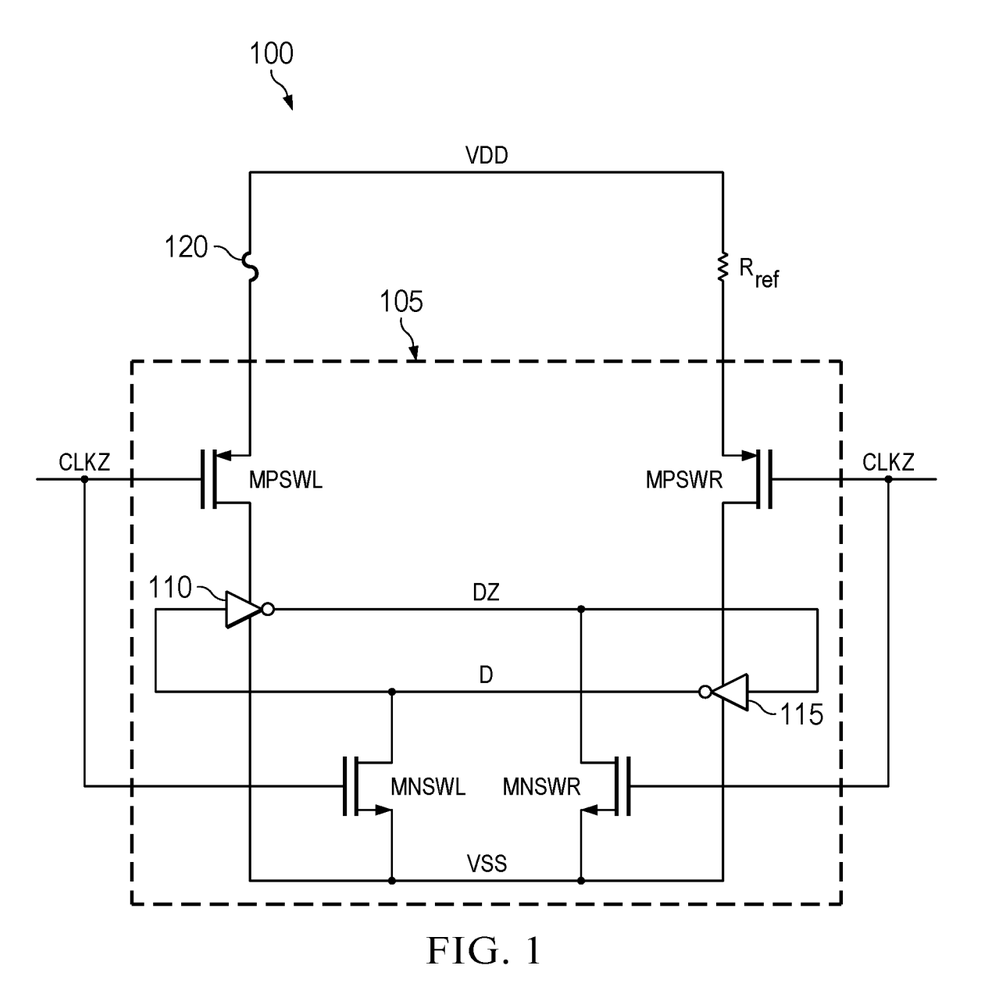
FIG. 1 illustrates a fuse memory cell circuit according to the disclosure.

Referring to FIG. 1, an electrically programmable memory cell 100 is schematically illustrated. The memory cell 100 includes a sense amplifier 105 that includes a latch having a first inverter 110 and a second inverter 115. The inverters 110, 115 are cross-coupled in a manner that may store a bit-value in a quasi-static fashion. For convenience of description the output of the inverter 115 is designated as the "D node", and the output of the inverter 110 is designated as the inverse of the D node, or the "DZ node". The inverters 110, 115 are configured with other components of the memory cell 100 in left-right symmetric fashion. A "left-hand leg" of the memory cell 100 includes a PMOS transistor MPSWL with a source connected to a fuse 120 and a drain connected to a positive power terminal of the inverter 110. An NMOS transistor MNSWL has a drain connected to the D node and a source connected to a lower power rail designated VSS. Similarly, a "right-hand leg" includes a PMOS transistor MPSWR with a source connected to $R_{ref}$ and a drain connected to a positive power terminal of the inverter 115. An NMOS transistor MNSWR has a drain connected to the DZ node and a source connected to VSS. During the positive phase of a CLKZ signal, the transistor MNSWL conductively connects the D node to VSS, and the transistor MNSWR conductively connects the DZ node to the VSS. During the negative phase of CLKZ, the transistor MPSWL conductively connects the positive power terminal of the inverter 110 to the fuse 120, and the transistor MPSWR conductively connects the positive power terminal of the inverter 115 to $R_{ref}$.

Negative power terminals of the inverters 110 and 115 are connected to the lower power rail in an unswitched fashion. Conversely, the inverter 110 is connected to an upper power rail, designated VDD, via the transistor MPSWL and the fuse 120, and the inverter 115 is connected to VDD via the transistor MPSWR and $V_{ref}$. The transistor MPSWL is directly connected to the first terminal of a fuse 120, and the MPSWR is directly connected to a first terminal of the reference resistor $R_{ref}$. A second terminal of the fuse 120 and a second terminal of $R_{ref}$ are both connected to VDD.

The fuse 120 may be formed from any material that can be patterned to form a current path that may be selectively broken to produce a high-resistance state between the first and second fuse terminals. In various examples, and as described without implied limitation, the fuse 120 is formed from polysilicon. In various examples the fuse 120 has an "hourglass" or "dog bone" shape, in which wide terminal portions with relatively low resistance are initially connected by a narrow conductive path having an initial resistance. A sufficiently high current, producing a commensurately high current density, may damage a portion of the narrow conductive path resulting in a programmed resistance that is typically much larger than the initial resistance. For example, the fuse 120 may have a resistance $R_{fuse}$ that has an initial, unprogrammed value of about 100Ω, and a programmed value greater than 50 kΩ.

The reference resistor $R_{ref}$ has a resistance that is greater than the unprogrammed resistance of the fuse 120 and less than the programmed resistance of the fuse 120. In one example, $R_{ref}$ may be about one-half of the minimum expected value of $R_{fuse}$ in the programmed state, for example 25 kΩ In various examples, $R_{ref}$ is significantly greater, e.g. >100×, than the unprogrammed resistance of the fuse 120.

In a non-read, or quiescent state, CLK is unasserted, resulting in MNSWL and MNSWR being switched on and pulling the D and DZ nodes to VSS. In a read state CLK is asserted, allowing D and DZ to settle to an active state. This condition results in insignificant power consumption by the memory cell 100. The value of the D node in the active state is determined by the relative resistance of $R_{fuse}$ and $R_{ref}$. As described in greater detail below, if $R_{fuse}<R_{ref}$, e.g. in an unprogrammed state, the D node will settle to an unasserted value, e.g. a digital "0" or FALSE state, and the DZ node will settle to an asserted value, e.g. a digital "1" or TRUE state. Conversely, if $R_{fuse}>R_{ref}$, e.g. in an programmed state, the D node will settle to a TRUE state, and the DZ node will settle to a FALSE state. After settling into the active state, insignificant power is consumed by the memory cell 100.

Figure 2:
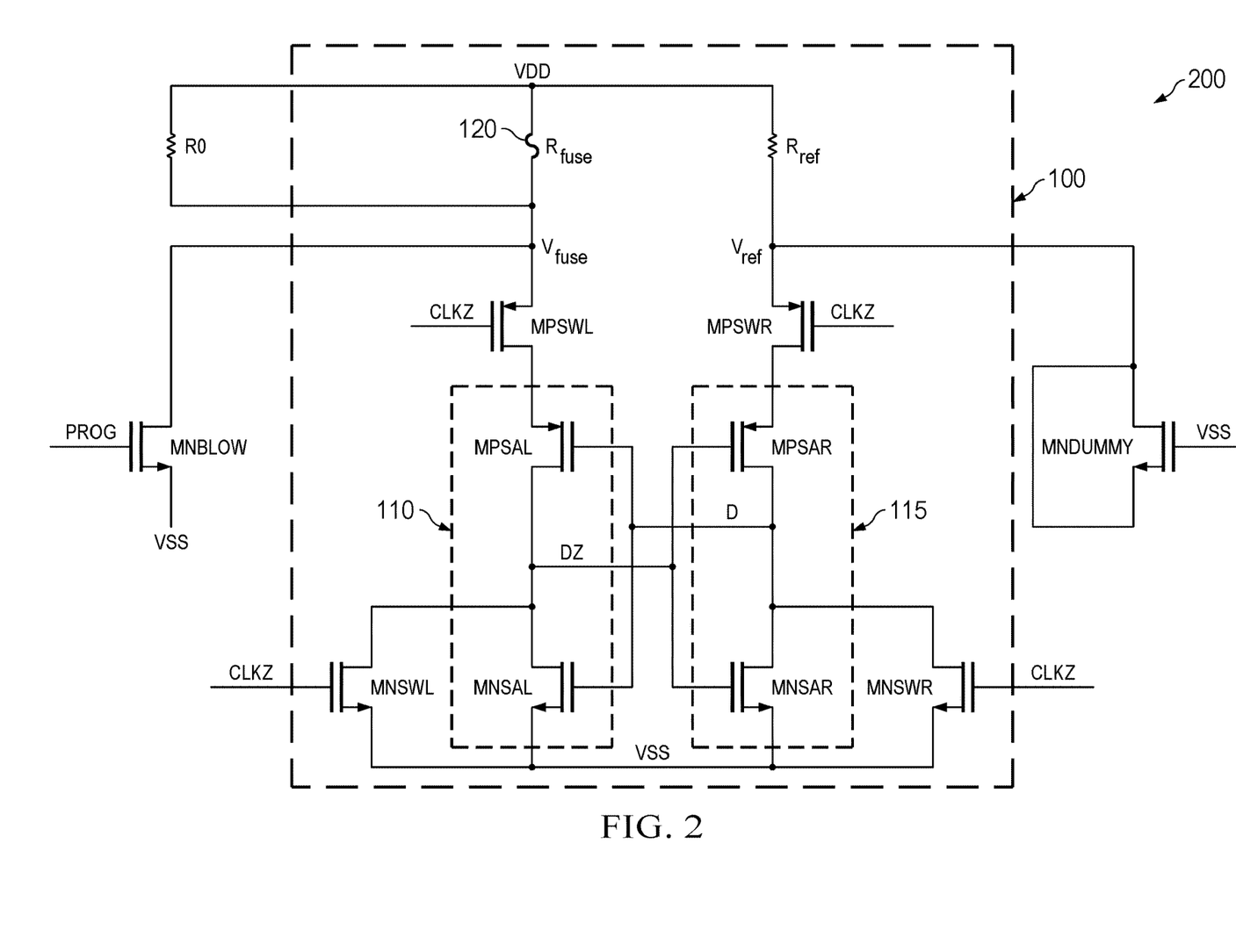
FIG. 2 illustrates a fuse memory cell circuit such as that shown in FIG. 1 with additional components.

FIG. 2 illustrates an example of a memory cell 200 in which the inverter 110 is implemented by a PMOS transistor MPSAL and an NMOS transistor MNSAL, and the inverter 115 is implemented by a PMOS transistor MPSAR and an NMOS transistor MNSAR. MPSAL and MNSAL are connected at a first output node that serves as the DZ node, and MPSAR and MNSAR are connected at a second output node that serves as the D node. Gate terminals of MPSAL and MNSAL are connected at a first input node connected to the D node, and gate terminals of MPSAR and MNSAR are connected at a second input node connected to the DZ node As described previously, in a quiescent state (e.g. CLK=FALSE and CLKZ=TRUE) the transistors MNSWL and MNSWR are switched on, holding the D and DZ node values to VSS. In a read state (e.g. CLK=TRUE and CLKZ=FALSE), MNSWL and MNSWR are switched off and MPSWL and MPSWR are switched on. Immediately following the transition from the quiescent state to the active state, MPSAL and MPSAR are switched on and MNSAL and MNSAR are switched off due to the immediately preceding VSS state of the D and DZ nodes. The state at which the D and DZ nodes settle is determined by a race between the left-hand leg and the right-hand leg. The combined resistance and capacitance of the components in the left-hand leg result in a first time constant $\tau_L$ that determines the rate at which the voltage of the DZ node increases from VSS, and the combined resistance and capacitance of the components in the right-hand leg result in a second time constant $\tau_R$ that determines the rate at which the voltage of the D node increases from VSS. If $\tau_L<\tau_R$ (unprogrammed state) DZ increases to a value sufficient to switch on MNSAR before D can increase to a value sufficient to switch on MNSAL, and the D and DZ nodes respectively settle to values of 0 and 1. On the other hand, if $\tau_L>\tau_R$ (programmed state) D increases to a value sufficient to switch on MNSAL before DZ can increase to a value sufficient to switch on MNSAR, and the nodes D and DZ nodes respectively settle to values of 1 and 0.

Figure 3:
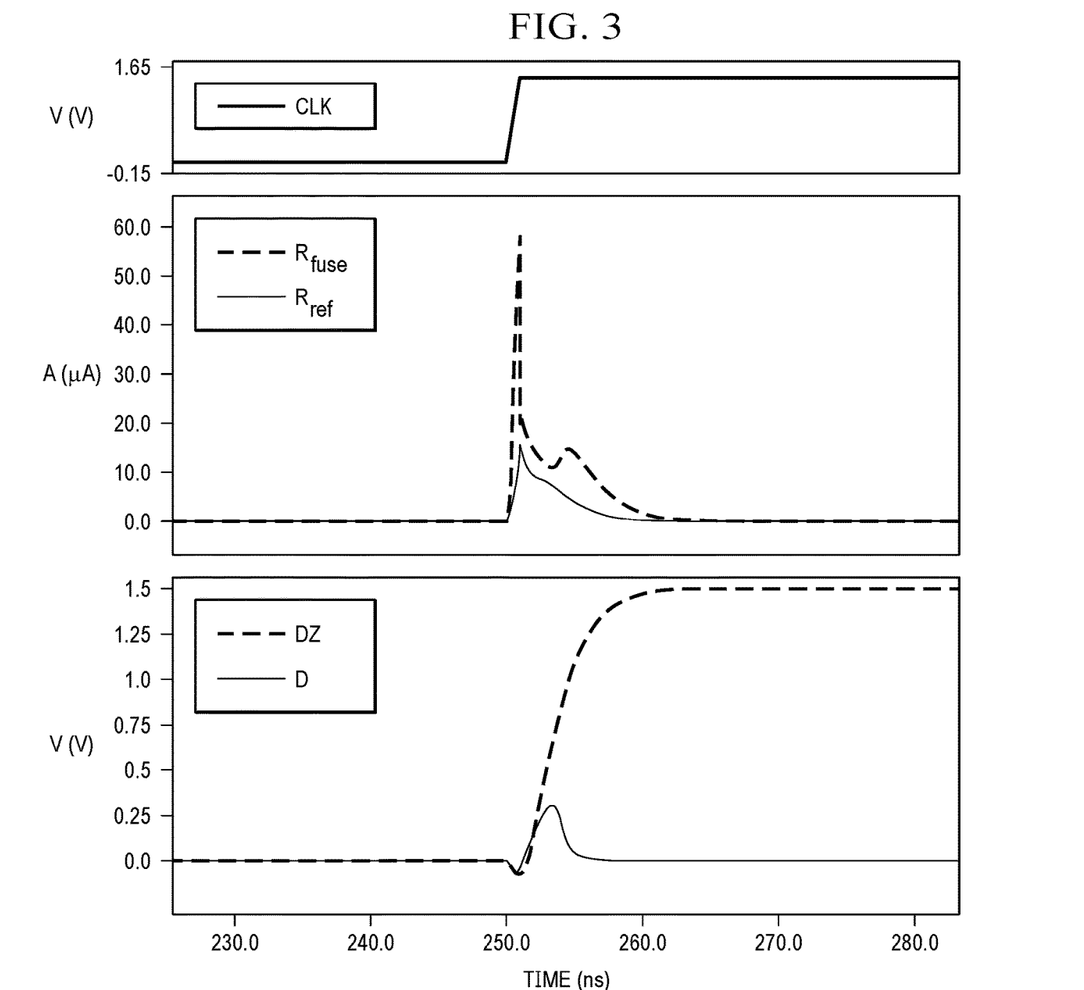
FIG. 3 presents a timing diagram illustrating aspects of operation of the fused memory cell circuits of FIGS. 1 and 2.

Read operation is exemplified in FIG. 3, which shows simulated voltage and current values versus time t at various nodes of the memory cell 100 for the example of $R_{fuse}=100Ω$ (unprogrammed) and $R_{ref}=25$ kΩ. Prior to t=250 ns, CLK is unasserted (CLKZ is asserted), the current through the fuse 120 and $R_{ref}$ are both zero, and the voltage at the D and DZ nodes is zero. CLK is asserted at t=250 ns, which results in a peak current of about 55 µA through the fuse 120 and a peak current of about 15 µA through the reference resistor $R_{ref}$. Initially the voltage at the D and DZ nodes increases about a same rate, but within 2-3 ns the voltage at the DZ node overtakes the voltage at the D node and the state of the memory cell 100 settles in the unprogrammed state. The current through the fuse 120 and $R_{ref}$ return to zero when the state of the memory cell 100 settles. Thus the static current is seen to be very low, e.g. ≤75 nA, and the read time is very short, e.g. <17 ns.

It is noted the voltages shown in FIG. 3 are only one example provided without implied limitation. In this example the circuit uses 5 V transistors and is operating between 0.9 V and 5.5 V, where 0.9 V is determined by the threshold voltage of the transistors and 5.5 V is determined as a reliable operating limit of a 5 V transistor. The voltage range of operation can be extended, e.g. by using low threshold-voltage (LVT) devices in some other examples.

Returning to FIG. 2, in various examples the transistors MPSWL and MPSWR are matched, e.g. have about a same (within manufacturing tolerance) resistance and capacitance. For example, each of these transistors may have a same gate length (or channel length) and a same gate width (or drive current). Similarly, in various examples MPSAL and MPSAR are matched, and MNSAL and MNSAR are matched. In some examples, all of the transistors in the memory cell 100 are closely spaced on a semiconductor substrate such that manufacturing variation is negligible between matched transistors.

Other components of the memory cell 200 include transistors MNBLOW and MNDUMMY. In a programming operation, MNBLOW is switched by an asserted PROG signal and acts to sink current through the fuse 120 if in the unprogrammed state. The drive current capacity of MNBLOW is selected to support a sufficient current to damage the narrow conductive path of the fuse 120, increasing the resistance from the unprogrammed value to the programmed value. The connection of MNBLOW to the fuse 120 terminal may increase the capacitance associated with the left-hand leg of the memory cell 100, and without compensation result in altering the timing of operation during the previously described settling period. In some examples, the MNDUMMY is a dummy transistor matched to the MNBLOW transistor to provide such compensation. In such examples the source and drain of MNDUMMY are connected so this transistor provides no active electrical function.

In an additional example, a shunt resistor R0 is connected to the terminals of the fuse 120 to inhibit growth of a low-resistance path between the terminals after the fuse 120 is blown. Such regrowth may result from the electric field between the terminals in the absence of the shunt resistor. In various examples R0 has a resistance at least twice that of a predetermined minimum resistance of the fuse 120 in the programmed state. Space permitting, it may be desirable that R0 has a resistance at least ten times that of the predetermined minimum resistance of the fuse 120 in the programmed state, e.g. about 500 kΩ.

Figure 4:
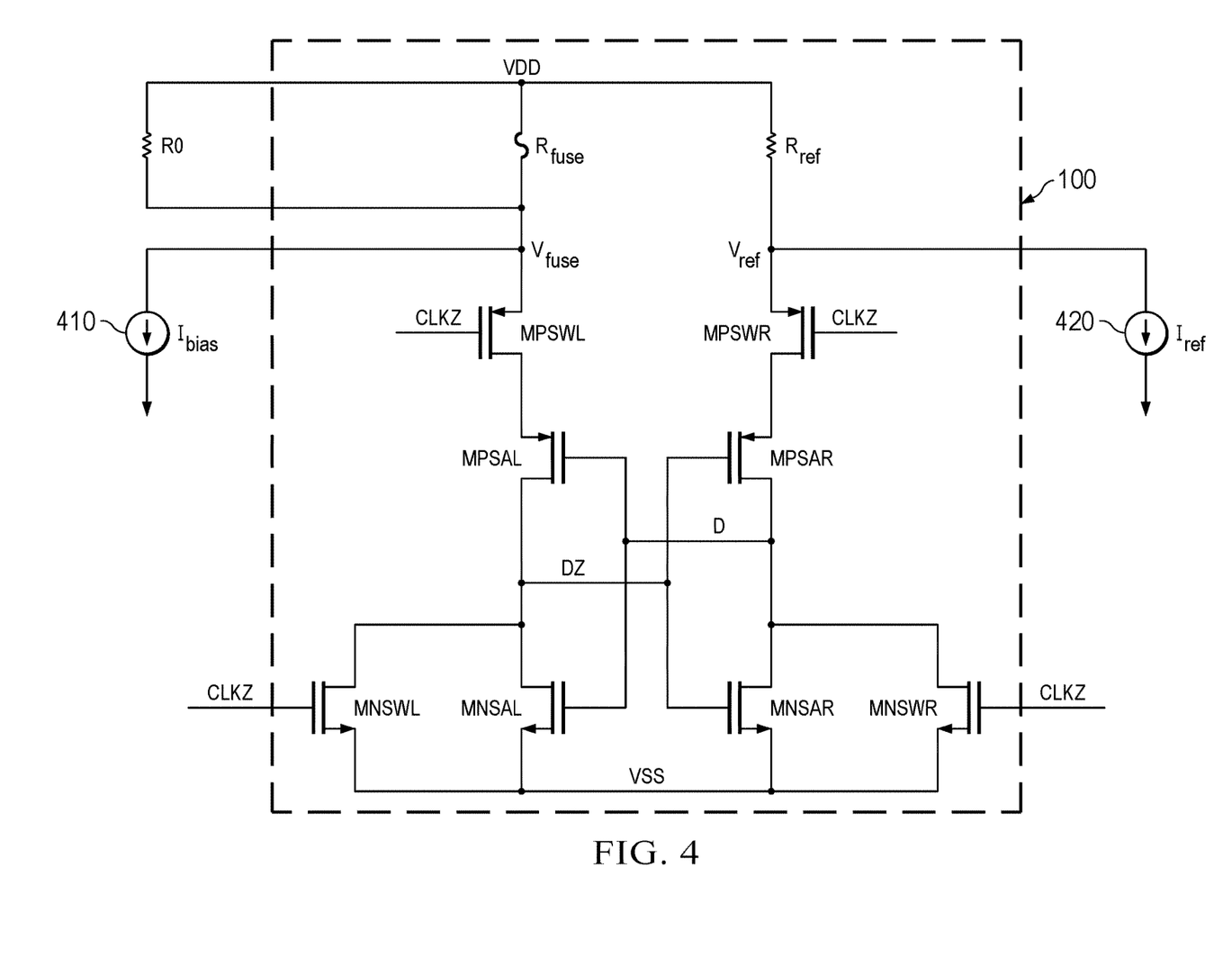
FIG. 4 illustrates a fuse memory cell circuit such as that shown in FIG. 2 including current sinks connected to a fuse and a reference resistor.

FIG. 4 illustrates the memory cell 100 in an example in which a first bias current sink 410 is connected to the fuse 120 and a second bias current sink 420 is connected to $R_{ref}$. This configuration may be used to test the operating margin of the memory cell 100 after programming the fuse 120. In an example, a minimum desired resistance of the fuse 120 after programming may be predetermined to be 50 kΩ. In the example that $R_{ref}$ has a value of 25 kΩ, the second bias current sink 420 may be configured to sink through $R_{ref}$ a bias current $I_{ref}$ that is two times (50 kΩ/25 kΩ) a bias current $I_{bias}$ drawn by the first bias current sink 410. This configuration may be used to test the operating margin of the memory cell 100 after programming the fuse 120. In another example, the minimum desired resistance of the fuse 120 after programming may be predetermined to be 100 kΩ, in which case $I_{ref}$ may be four times $I_{bias}$. The configuration of $I_{ref}$ as a multiple of $I_{bias}$ allows $R_{ref}$ to be made smaller than the minimum desired resistance of the fuse in the programmed state, reducing the die area needed to implement $R_{ref}$. As $R_{ref}$ is made smaller, $I_{ref}$ may be increased to produce the desired voltage drop across $R_{ref}$, increasing the size of the components implementing the current sink 420 and/or interconnections to $R_{ref}$, or even risking damaging $R_{ref}$. Thus in various examples a minimum ratio of $I_{ref}$ to $I_{bias}$ may be 2 to limit the size of such components.

When the CLK is unasserted and the current sinks 410, 420 are operated, a voltage $V_{fuse}$ is produced at the node between the fuse 120 and the transistor MPSWL. Similarly, a voltage $V_{ref}$ is produced at the node between $R_{ref}$ and the transistor MPSWR. Under example conditions in which $R_{ref}$ has a value of 25 kΩ and $I_{ref}=4*I_{fuse}$, if $V_{fuse}<V_{ref}$ then $R_{fuse}$ can be inferred to be greater than 100 kΩ. Conversely, if $V_{fuse}>V_{ref}$ then $R_{fuse}$ can be inferred to be less than the predetermined minimum of 100 kΩ. In response to this condition, which may fail to meet a desired margin specification, the IC in which the memory cell 100 is implemented may be scrapped.

The described principle can be generalized such that the second bias current sink 420 is configured such that to $I_{ref}$ is n times greater than $I_{bias}$. $V_{fuse}$ will equal $V_{ref}$ when $R_{fuse}=n*R_{ref}$, or n*25 kΩ in the case that $R_{ref}=25$ kΩ. Furthermore, in general the ratio $I_{ref}/I_{bias}$ need not be an integer value.

The current sinks 410, 420 may be provided by current sinks that are integrated into the IC, or may be provided external to the IC, such as in a multi-probe test configuration. When integrated into the IC, the current sinks 410, 420 provide the ability to determine if the resistance of the fuse 120 meets the predetermined operating margin independently of an external tester, including after deployment in an electronic system. On the other hand, if one or both of the current sinks 410, 420 are provided externally, then $I_{bias}$ and/or $I_{ref}$ may be varied as desired to determine an arbitrary operating margin ratio, and multiple test measurements may be performed, e.g. to determine the actual value of $R_{fuse}$.

Figure 5:
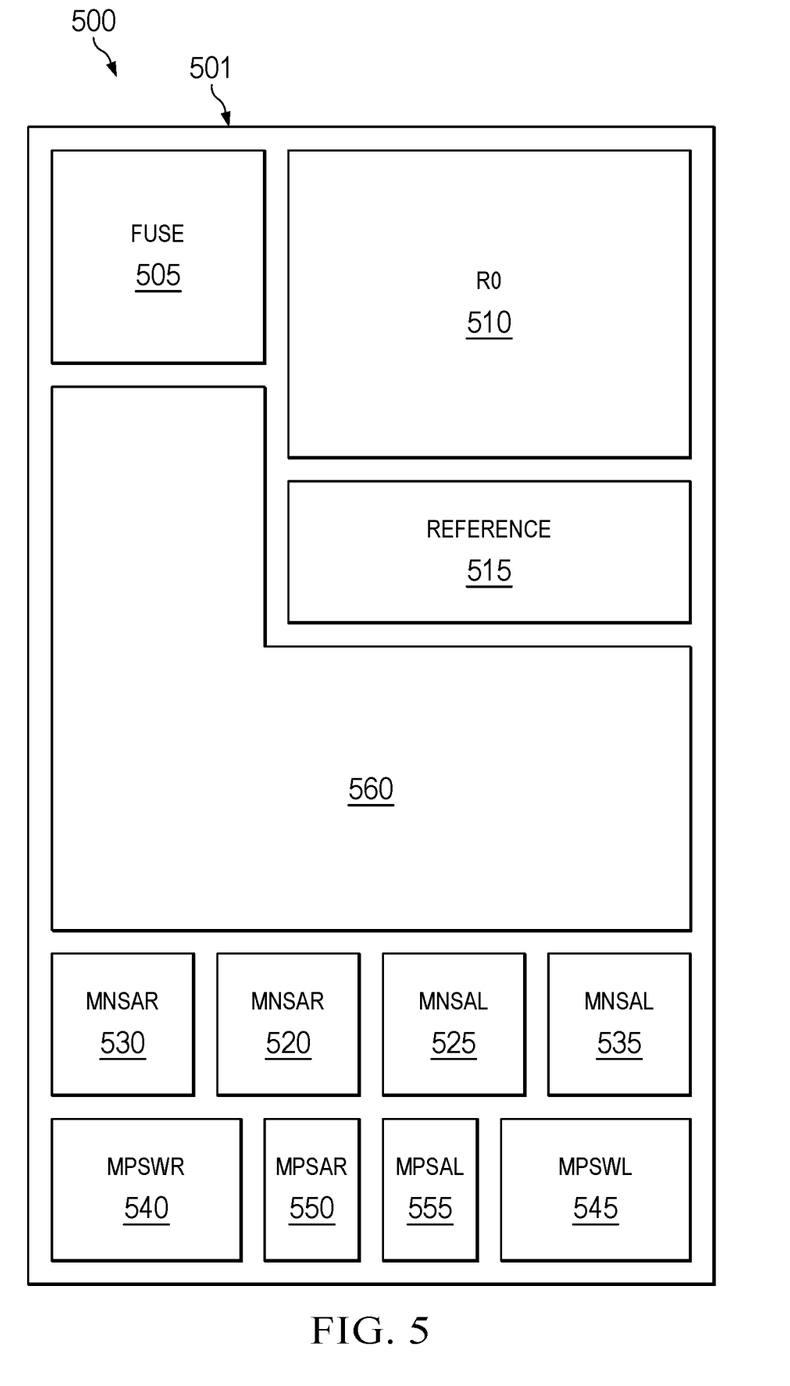
FIG. 5 illustrates an implementation of a fused memory cell circuit such as that shown in FIG. 2 on a semiconductor die.

FIG. 5 illustrates a memory cell 500 as implemented on a silicon substrate 501 in various examples. Various designations of features of the memory cell 500 may correspond to features previously described. The memory cell 500 includes a fuse structure 505 and a shunt resistor 510, respectively exemplified by the fuse 120 and the shunt resistor R0 of FIG. 2. A reference resistor 515, exemplified by the resistor $R_{ref}$ of FIG. 2, is located below the shunt resistor 510. The fuse structure 505 may be formed at least in part in a polysilicon layer or a metal interconnect layer over the substrate 501. The resistors 510, 515 may be formed in a polysilicon layer over the substrate 501, or in a diffusion region extending into the substrate 501. Transistors 520 and 525 exemplify the transistors MNSAR and MNSAL of FIG. 2; transistors 530 and 535 exemplify the transistors MNSAR and MNSAL of FIG. 2; transistors 540 and 545 exemplify the transistors MPSWR and MPSWL of FIG. 2; and transistors 550 and 555 exemplify the transistors MPSAR and MPSAL of FIG. 2. Each of the transistors 520, 525, 530, 535, 540, 545, 550 and 555 may be formed over and extending into the substrate 501 by any current or future-discovered methods. In various examples, Transistors 520 and 525 are matched, transistors 530 and 535 are matched, transistors 540 and 545 are matched, and/or transistors 550 and 555 are matched. Logic functions 560 related to other operating characteristics of the memory cell 500 are located between the fuse structure 505 and resistors 510, 515 and the transistors 520 . . . 555.

Figure 6:
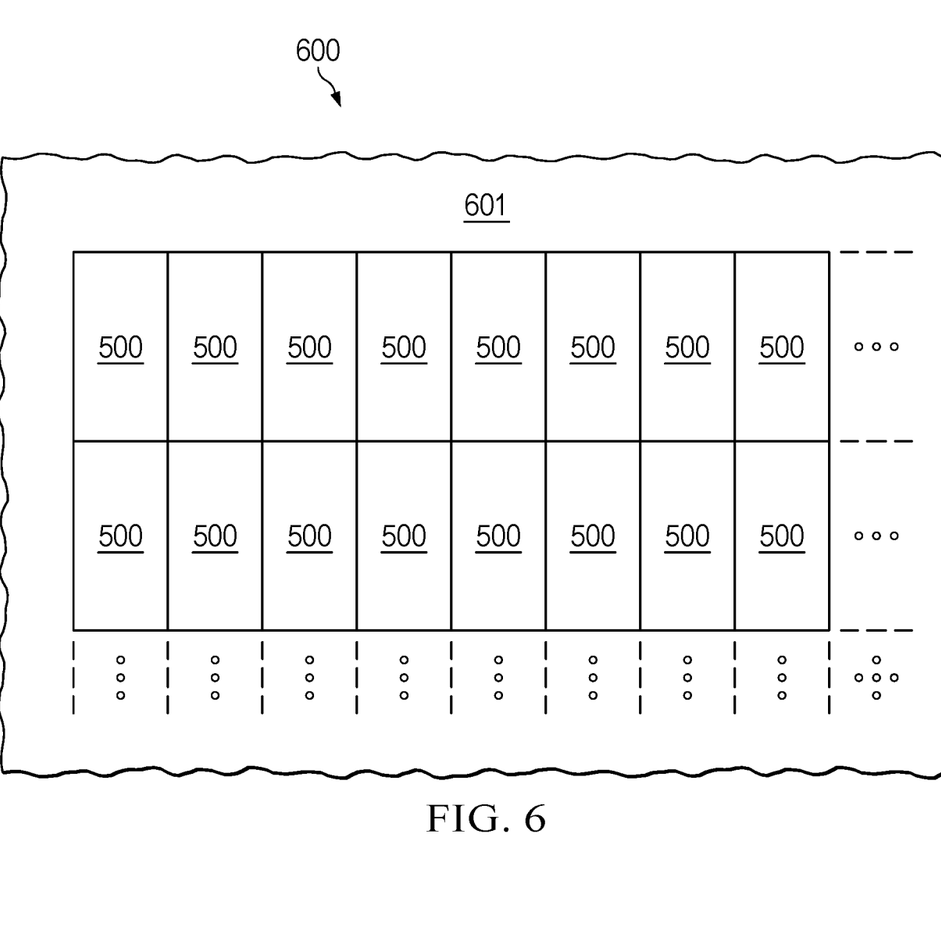
FIG. 6 illustrates an array of fused memory cell circuits such as that shown in FIG. 5.

FIG. 6 illustrates an array 600 of the memory cells 500 as may be formed in an integrated circuit. Any number of the memory cells 500 may be formed over and extending into a semiconductor substrate 601. In the illustrated example, a number, e.g. 16, of the memory cells 500 are formed as a two-dimensional array. In other examples, an array of the memory cells 500 may be one-dimensional, or may be located arbitrarily within an integrated circuit design.

Figure 7:
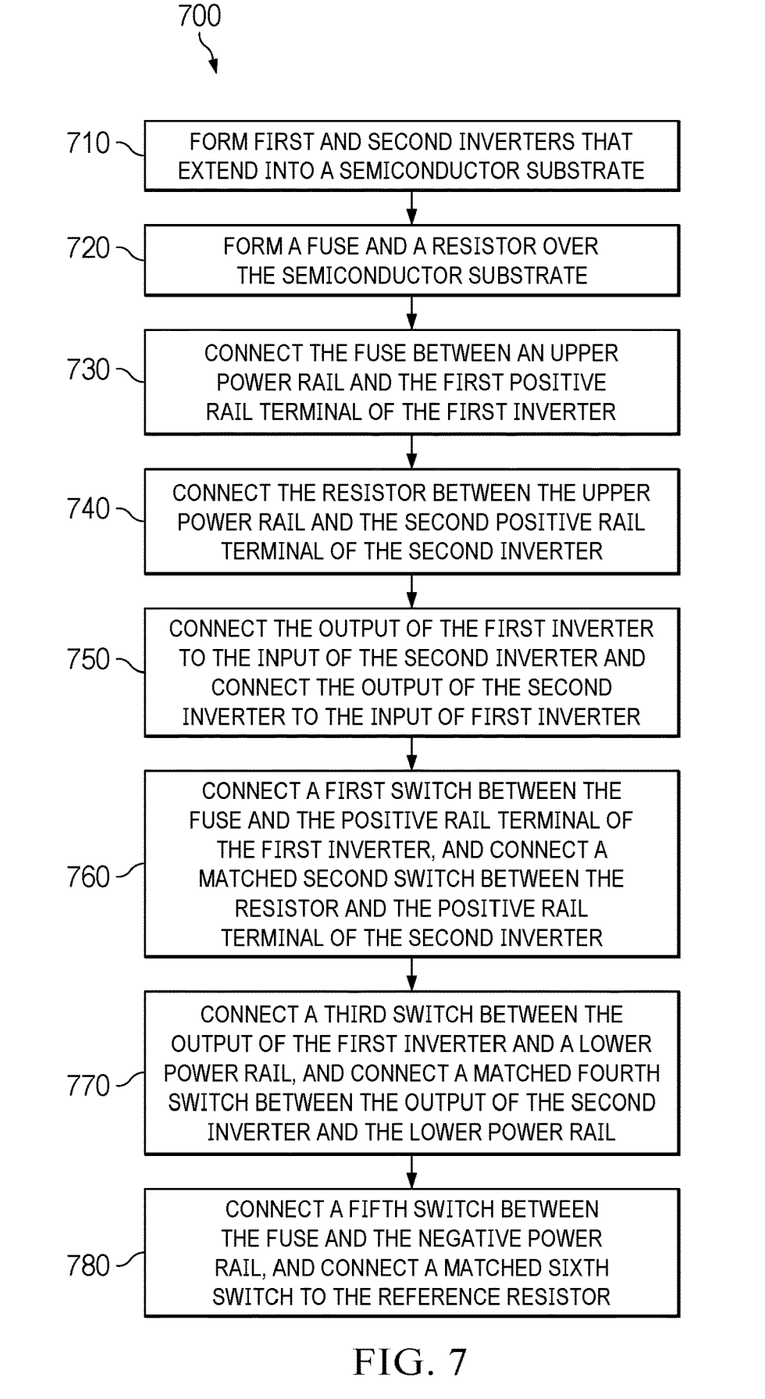
FIG. 7 illustrates a method of forming an integrated circuit according to various examples.

FIG. 7 describes a method 700 of forming an integrated circuit as described in the present disclosure. In a step 710 first and second inverters are formed extending into a semiconductor substrate. The first inverter has a first positive power terminal, a first output at a first output node, and a first input node. The second inverter has a second positive power terminal, a second output at a second output node, and a second input node.

In a step 720 a fuse and a resistor are formed over the semiconductor substrate.

In a step 730 the fuse is connected between an upper power rail and the first positive power terminal of the first inverter.

In a step 740 the resistor is connected between the upper power rail and the second positive power terminal of the second inverter.

In a step 750 the output node of the first inverter is connected to the input node of the second inverter and the output node of the second inverter is connected to the input node of first inverter.

In a step 760 a first switch is connected between the fuse and the positive power terminal of the first inverter, and a second switch is connected between the resistor and the positive power terminal of the second inverter.

In a step 770 a third switch is connected between the output node of the first inverter and a lower power rail, and a fourth switch is connected between the output node of the second inverter and the lower power rail. The first and second switches are configured to provide low resistance during a first phase of a control signal, and the third and fourth switches are configured to provide low resistance during a second phase of the control signal.

In a step 780 a fifth switch is connected between the fuse and the negative power rail, and a sixth switch is connected to the reference resistor. The fifth switch is configured to provide low resistance in response to a programming signal.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

The invention claimed is:

1. An integrated circuit, comprising:
    a sense amplifier including:
        a first inverter having a first positive power terminal, a first input and a first output; and
        a second inverter having a second positive power terminal, a second input connected to the first output and a second output connected to the first input;
    a reference resistor connected between a positive voltage rail and the second positive power terminal; and
    a fuse connected between the positive voltage rail and the first positive power terminal; and
    a first switch transistor connected between the fuse and the first positive power terminal, a second switch transistor connected between the reference resistor and the second positive power terminal, a third switch transistor connected between the first output and a lower voltage rail, and a fourth switch transistor connected between the second output and the lower voltage rail.

2. The integrated circuit of claim 1, further comprising a programming transistor connected to the fuse and a dummy transistor connected to the reference resistor.

3. The integrated circuit of claim 1, further comprising a shunt resistor connected in parallel with the fuse.

4. The integrated circuit of claim 1, wherein the first output is configured to settle to a FALSE state and the second output is configured to settle to a TRUE state on the condition that the resistance of the fuse is greater than the resistance of the reference resistor.

5. The integrated circuit of claim 1, wherein the fuse is a polysilicon fuse.

6. The integrated circuit of claim 1, further comprising a current sink connected to the fuse.

7. The integrated circuit of claim 6, wherein the current sink is a first current sink, and further comprising a second current sink connected to the reference resistor.

8. The integrated circuit of claim 7, wherein the first current sink is configured produce a first current, and the second current sink is configured produce a second current at least two times the first current.

9. A method of forming an integrated circuit, comprising:
    forming first and second inverters that extend into a semiconductor substrate;
    forming a fuse and a resistor over the semiconductor substrate;
    connecting the fuse between an upper power rail and a positive power terminal of the first inverter;
    connecting a first switch transistor between the fuse and the first positive power terminal, a second switch transistor between the resistor and the second positive power terminal, a third switch transistor between the first output and a lower voltage rail, and a fourth switch transistor between the second output and the lower voltage rail;
    connecting the resistor between the upper power rail and a positive power terminal of the second inverter; and
    connecting an output of the first inverter to an input of the second inverter, and an output of the second inverter to an input of the first inverter.

10. The method of claim 9, further comprising connecting a shunt resistor in parallel with the fuse between the positive power terminal of the first inverter.

11. The method of claim 9, further comprising connecting a first transistor between the fuse and the positive power terminal of the first inverter, and connecting a second transistor between the resistor and the positive power terminal of the second inverter.

12. The method of claim 11, wherein the output of the second inverter is configured to settle to a TRUE state on the condition that the first and second transistors are in a low-resistance state and the resistance of the fuse is greater than the resistance of the resistor.

13. The method of claim 9, wherein the first and second inverters are each implemented by a respective PMOS transistor and a respective NMOS transistor.

14. The method of claim 9, wherein the fuse is a polysilicon fuse.

15. The method of claim 9, further comprising connecting a programming transistor to the fuse.

16. The method of claim 15, further comprising connecting a dummy transistor to the resistor, the dummy transistor matched to the programming transistor.

17. The method of claim 9, further comprising connecting to the fuse a first current sink configured to produce a first current and connecting to the resistor a second current sink configured produce a second current that is at least two times the first current.

18. An integrated circuit, comprising:
    a first NMOS transistor and a first PMOS transistor formed over a semiconductor substrate, the first NMOS transistor and the first PMOS transistor connected to form a first inverter having a first input node, a first output node and a first power terminal;
    a second NMOS transistor and a second PMOS transistor formed over the semiconductor substrate, the second NMOS transistor and the second PMOS transistor connected to form a second inverter having a second input node, a second output node and a second power terminal, the first output node connected to the second input node, and the second output node connected to the first input node; and
    a reference resistor connected between a positive voltage rail and a source of the first PMOS transistor;
    a fuse connected between the positive voltage rail and a source of the second PMOS transistor; and
    a third NMOS transistor connected between the fuse and the first power terminal, a fourth NMOS transistor connected between the reference resistor and the second power terminal, a fifth NMOS transistor connected between the first output and a lower voltage rail, and a sixth NMOS transistor connected between the second output and the lower voltage rail.

* * * * *